United States Patent
Iwasaki et al.

[11] Patent Number: 5,847,572
[45] Date of Patent: Dec. 8, 1998

[54] PARTLY REPLACEABLE DEVICE FOR TESTING A MULTI-CONTACT INTEGRATED CIRCUIT CHIP PACKAGE

[75] Inventors: Hidekazu Iwasaki; Hiroshi Matsunaga; Takehiko Ohkubo, all of Tokyo, Japan

[73] Assignees: Mitsubishi Denki Kabushiki Kaisha; Unitechno, Inc., both of Tokyo, Japan

[21] Appl. No.: 778,666

[22] Filed: Jan. 3, 1997

[30] Foreign Application Priority Data

Oct. 1, 1996 [JP] Japan ..................................... 8-001969

[51] Int. Cl.⁶ ................................................... G01R 31/02
[52] U.S. Cl. ............................ 324/755; 439/91; 324/754; 324/757
[58] Field of Search ..................... 324/755, 754, 324/765, 757; 439/91

[56] References Cited

U.S. PATENT DOCUMENTS

| | | | |
|---|---|---|---|
| 4,778,950 | 10/1988 | Lee et al. ........................... | 174/35 GC |
| 5,163,837 | 11/1992 | Rowlette, Sr. ........................ | 439/91 |
| 5,180,888 | 1/1993 | Sugiyama et al. ..................... | 174/94 R |
| 5,406,211 | 4/1995 | Inoue et al. .......................... | 324/758 |
| 5,592,365 | 1/1997 | Sugimoto et al. ..................... | 361/789 |
| 5,613,861 | 3/1997 | Smith et al. .......................... | 439/81 |
| 5,626,481 | 5/1997 | Abe ...................................... | 439/73 |

FOREIGN PATENT DOCUMENTS 7-47828  3/1991  Japan .

Primary Examiner—Ernest F. Karlsen
Assistant Examiner—Russell M. Kobert
Attorney, Agent, or Firm—Ratner & Prestia

[57] ABSTRACT

Herein disclosed is a test device for testing an integrated circuit (IC) chip having side edge portions each provided with a set of lead pins. The test device comprises a socket base, contact units each including a contact support member and socket contact members, and anisotropic conductive sheet assemblies each including an elastic insulation sheet and conductive members. The anisotropic conductive sheet assemblies are arranged to hold each conductive member in contact with one of the socket contact members of the contact units. The test device further comprises a contact retainer detachably mounted on the socket base to bring the socket contact members into contact with the anisotropic conductive sheet assemblies to establish electrical communication between the socket contact members and the conductive members of the anisotropic conductive sheet assemblies. Each of the contact units can be replaced by a new contact unit if the socket contact members partly become fatigued, thereby making it possible to facilitate the maintenance of the test device. Furthermore, the lead pins of the IC chip can be electrically connected to a test circuit board with the shortest paths formed by part of the socket contact members and the conductive members of the anisotropic conductive sheet assemblies.

10 Claims, 5 Drawing Sheets

PARTLY REPLACEABLE DEVICE FOR TESTING A MULTI-CONTACT INTEGRATED CIRCUIT CHIP PACKAGE

BACKGROUND OF THE INVENTION

The present invention relates to a test device for testing a multi-contact integrated circuit (herein referred to simply as "IC") chip, and in particular to a test device suitable for the so-called "burn-in test" or "handler test" and including a socket base on which the multi-contact IC chip of a flat packaging or dual inline packaging type is to be set.

As is generally known, such an IC chip is apt to encounter a circuit failure at an initial or last stage of the average life time of the IC chip, while such the circuit failure rarely occurs during an intermediate stage between the initial and last stages of the average life time. The frequency of such the circuit failure occurrence can therefore be represented by a curve called "bathtub curve" which is utilized for many IC chip tests such as a burn-in test and other shipping tests for ICs.

The burn-in test is performed by an exclusive test circuit board called "burn-in board" under the state that dozens of test sockets are mounted on the burn-in board. One of the typical prior art test sockets is generally shown in FIG. 5 with reference numeral "2" as comprising a socket base 2a formed with a square central cavity 3, and four contact rows 4 each including a set of socket contact members 5. FIG. 5 also shows an IC chip 1 of quadrilateral and flat packaging type that has four sets of lead pins 1a arranged on four sides of the IC chip 1. The IC chip 1 is received in the central cavity 3 of the test socket 2 to have the lead pins 1a of the IC chip 1 electrically connected to the burn-in board through the socket contact members 5. In the arrangement shown in FIG. 5, two rows of socket contact members 5 are hidden by the socket base 2a of the test socket 2. The IC chip 1 in the central cavity 3 is depressed by depressing means not shown in the drawings at an adequate pressure, and tested by performing a screening operation at an atmospheric temperature more than 100° C. to screen in a short time every IC chip that is likely to develop trouble or to break down.

As best shown in FIG. 6, the socket contact members 5 are arranged in each row at a constant pitch to form one of the contact rows 4. Each of the socket contact members 5 consists of a contact end portion 5a, an elastic arm portion 5b, a base portion 5c and an insert pin portion 5d. The contact end portions 5a of the socket contact members 5 are respectively supported by the base portions 5c through the elastic arm portions 5b to be displaced by depressing force from the lead pins 1a of the IC chip 1, while the insert pin portions 5d of the socket contact members 5 are fitted into a plurality of through holes 3a formed in the test socket 2. The pin portions 5d of the socket contact members 5 protruding from the bottom surface of the test socket 2 are each inseparably soldered with the burn-in board. This means that the test socket 2 is inseparably mounted on the burn-in board through the soldered pin portions 5d of the socket contact members 5.

The above prior-art test device, however, encounters a drawback that the elastic arm portions 5b of the socket contact members 5 are apt to be fatigued and damaged so that the test socket 2 is required to be replaced by a new test socket in spite of the fact that the dozens of the insert pin portions 5d of the socket contact members 5 are soldered with the burn-in board and that the test socket 2 and other test sockets each having the socket contact members 5 are not easily removable from the burn-in board. The burn-in board with the dozens of test sockets is therefore destined to be replaced by a new burn-in board. In addition, the prior-art test socket 2 is required to be replaced by a new test socket in an early stage of its average life time in the case that the test device is utilized for testing relatively quick-access IC chips.

SUMMARY OF THE INVENTION

It is therefore an object of the present invention to provide a test device partly replaceable and capable of lasting long.

It is another object of the present invention to provide a test device capable of lasting long even in the case that the test device is utilized for testing quick-access integrated circuit chips.

According to one aspect of the present invention there is provided a test device for testing a multi-contact integrated circuit (IC) chip having a plurality of side edge portions each provided with a set of contact members. The test device comprises a socket base having the integrated circuit chip detachably mounted thereon, a plurality of contact units (or modules) each including a contact support member and a set of socket contact members supported by the contact support member in spaced relationship to one another, and a plurality of anisotropic conductive sheet assemblies received in the socket base and each including an elastic insulation sheet and a plurality of conductive members supported by the elastic insulation sheet in spaced relationship to one another. The test device further comprises a contact retainer detachably mounted on the socket base to have the socket contact members of the contact units brought into contact with the conductive members of the anisotropic conductive sheet assemblies and positioned to be contactable with the contact leads of the integrated circuit chip, thereby establishing electrical communication between each of the socket contact members of the contact units and the conductive members of the anisotropic conductive sheet assemblies.

According to another aspect of the present invention there is provided a test device for testing a multi-contact IC chip having a plurality of side edge portions each provided with a set of contact leads. The test device comprises a test circuit board having a plurality of contact portions and operable to perform a testing operation for testing the integrated circuit chip, a socket base having the integrated circuit chip detachably mounted thereon and being mounted on the test circuit board, a plurality of contact units each including a contact support member and a set of socket contact members supported by the contact support member in spaced relationship to one another, and a plurality of anisotropic conductive sheet assemblies each including an elastic insulation sheet and a plurality of conductive members supported by the elastic insulation sheet in spaced relationship to one another. The anisotropic conductive sheet assemblies are received in the socket base to have each of the conductive members held in contact with one of the contact portions of the test circuit board. The test device further comprises a contact retainer detachably mounted on the socket base to have the socket contact members of the contact units brought into contact with the conductive members of the anisotropic conductive sheet assemblies and positioned to be contactable with the contact leads of the IC chips, thereby establishing electrical communication between each of the socket contact members of the contact units and each of the contact portions of the test circuit board through the conductive members of the anisotropic conductive sheet assemblies.

The above socket base may have a plurality of through holes formed therein and respectively having the anisotropic conductive sheet assemblies received therein. Each of the socket contact members of the contact units may have an arm portion held in pressing contact with part of the conductive members of the anisotropic conductive sheet assemblies on the test circuit board, and a projection portion projecting from the arm portions toward one of the contact leads of the integrated circuit chip.

The conductive members of the anisotropic conductive sheet assemblies may be composed of conductive minute wires, and extend in parallel to one another in the same direction slanting with respect to one and the other surfaces of the elastic insulation sheet. In this case, the conductive members of the anisotropic conductive sheet assemblies preferably have their both axial ends which are respectively flush with one and the other surfaces of the elastic insulation sheet, and the both axial ends of the conductive members are arranged along the conductive member. The socket base may be formed with a central cavity having the contact retainer fitted into the socket base and having the integrated circuit chip removably received therein.

BRIEF DESCRIPTION OF THE DRAWINGS

The features and advantages of a test device for a multi-contact IC chip according to the present invention will be more clearly understood from the following description taken in conjunction with the accompanying drawings in which.

DESCRIPTION OF THE PREFERRED EMBODIMENTS

Figure 1:
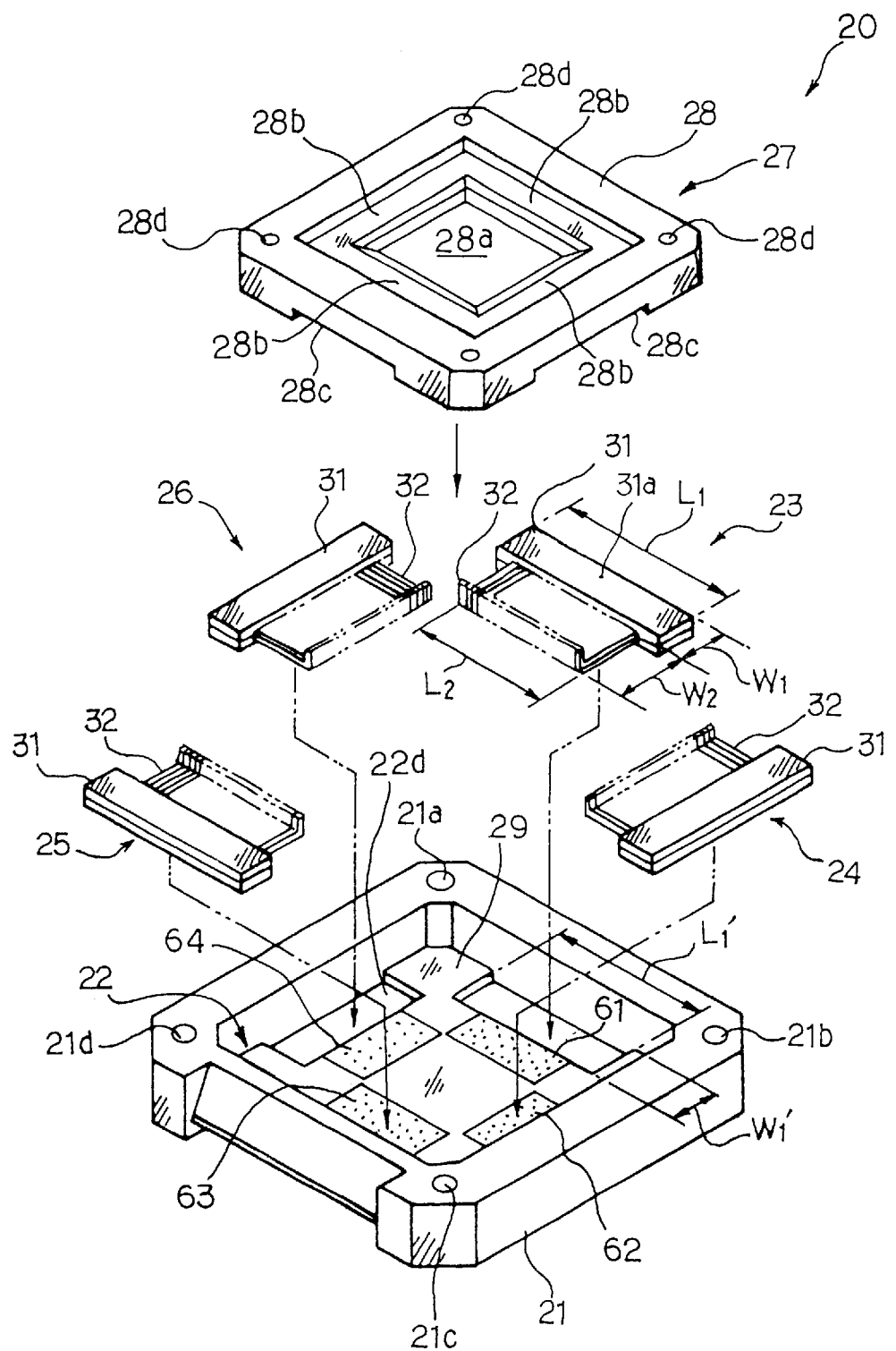
FIG. 1 is an exploded perspective view of an embodiment of the test device according to the present invention.
Figure 2:
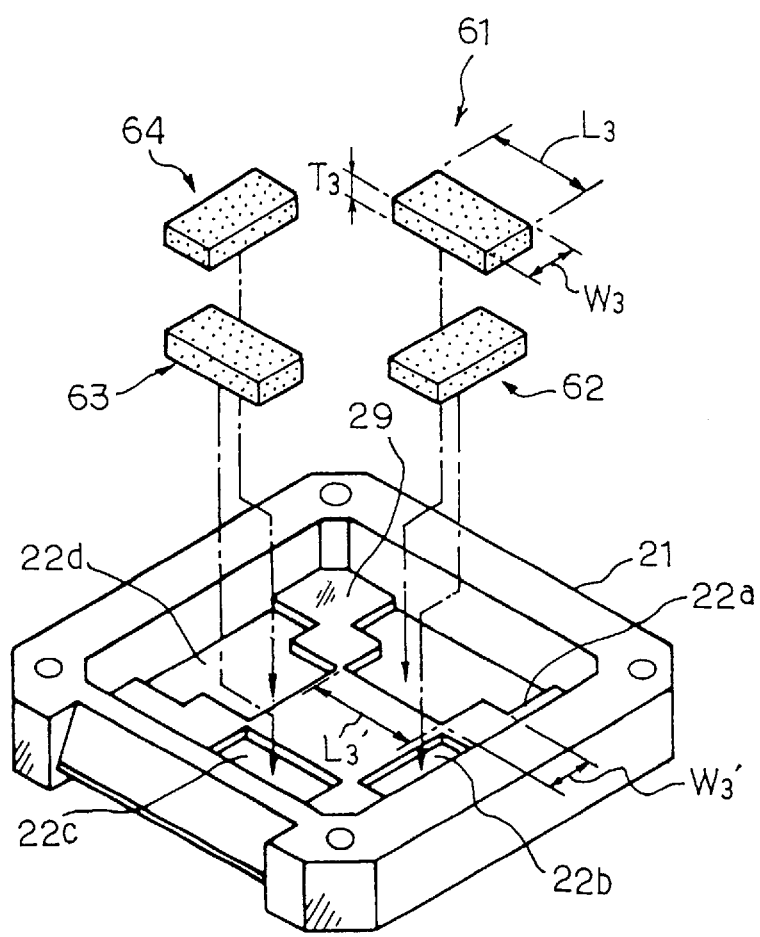
FIG. 2 is an enlarged perspective view of a test socket and anisotropic conductive sheets each forming part of the test device.
Figure 3:
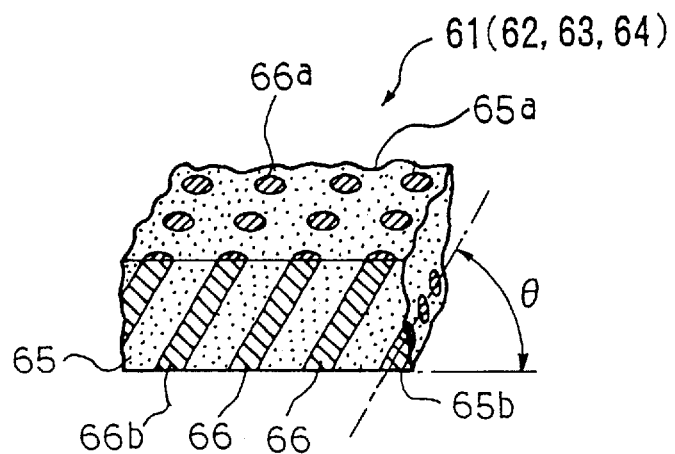
FIG. 3 is an enlarged fragmentary sectional view of each anisotropic conductive sheet.

Referring to FIGS. 1 to 4 of the drawings, a preferred embodiment of a test device for testing a multi-contact integrated circuit (IC) chip, embodying the present invention, is shown as comprising a test socket 20 and a print-circuit board 40 such as for example a burn-in board having the test socket 20 supported thereon. The test socket 20 includes a socket base 21 made of an insulation material and having the IC chip 10 detachably mounted thereon, a plurality of contact units 23, 24, 25 and 26 each removably mounted on the socket base 21, and retaining means 27 including a contact retainer 28 and four retainer screws not shown in the drawings for retaining the contact units 23 through 26. The socket base 21 is formed with a central cavity 22 and four cylindrical through holes 21a, 21b, 21c and 21d into which four socket mounting screws not shown in the drawings are respectively inserted to removably mount the socket base 21 on the print-circuit board 40. The central cavity 22 of the socket base 21 and the contact retainer 28 are exemplified as having their generally square cross sections as best understood from FIG. 1. The contact retainer 28 is formed with a square center hole 28a, and has four pressing portions 28b around the center hole 28a. This contact retainer 28 is made of an insulation material to have a generally square cross section approximately the same as or slightly smaller than that of the central cavity 22. The print-circuit board 40 is composed of a test circuit board, e.g. a burn-in board, which includes a plurality of contact portions 41 partly shown in FIG. 4 and is operable to perform a testing operation for testing multi-contact IC chips. Each of the above socket mounting screws may be replaced by another means for depressing or clamping the socket base 21 on the print-circuit board 40, while each of the retainer screws may be replaced by another means for separably clamping the contact retainer 28 with the socket base 21.

Figure 4:
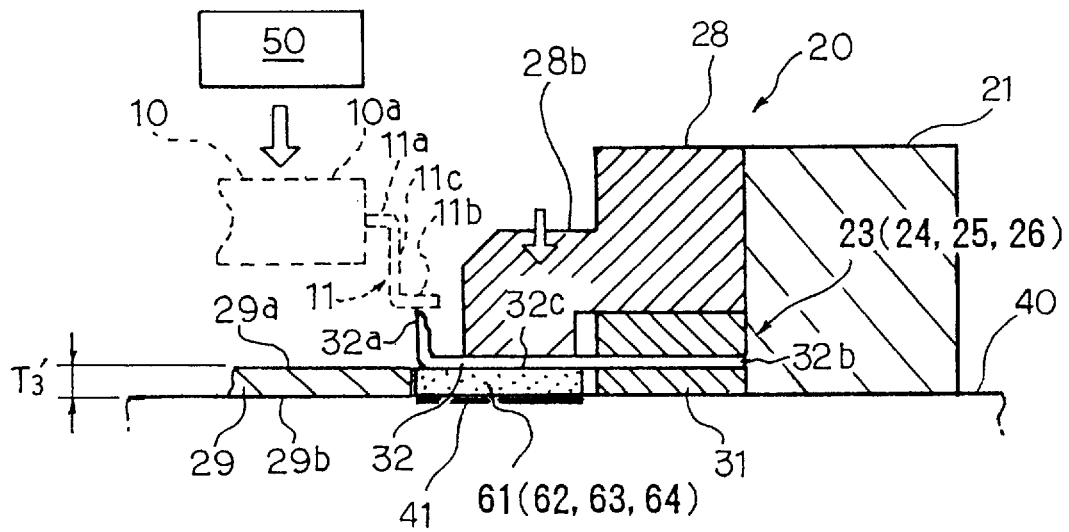
FIG. 4 is an enlarged fragmentary cross-sectional view showing a contact unit forming part of the test device.
Figure 5:
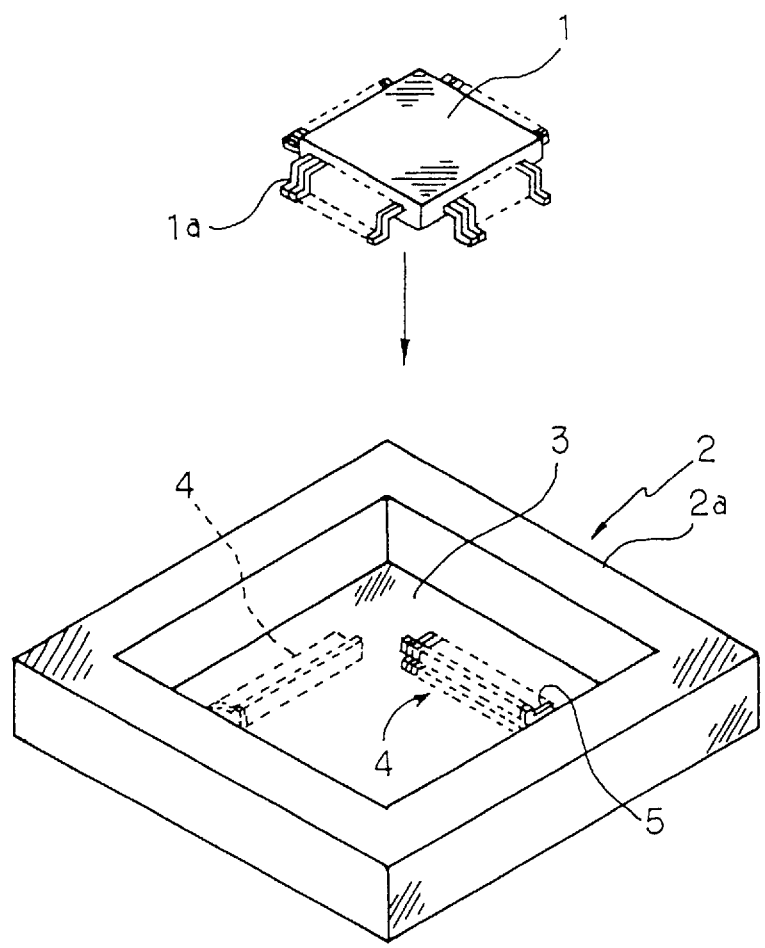
FIG. 5 is an exploded perspective view of a prior-art test device for a multi-contact IC chip.
Figure 6:
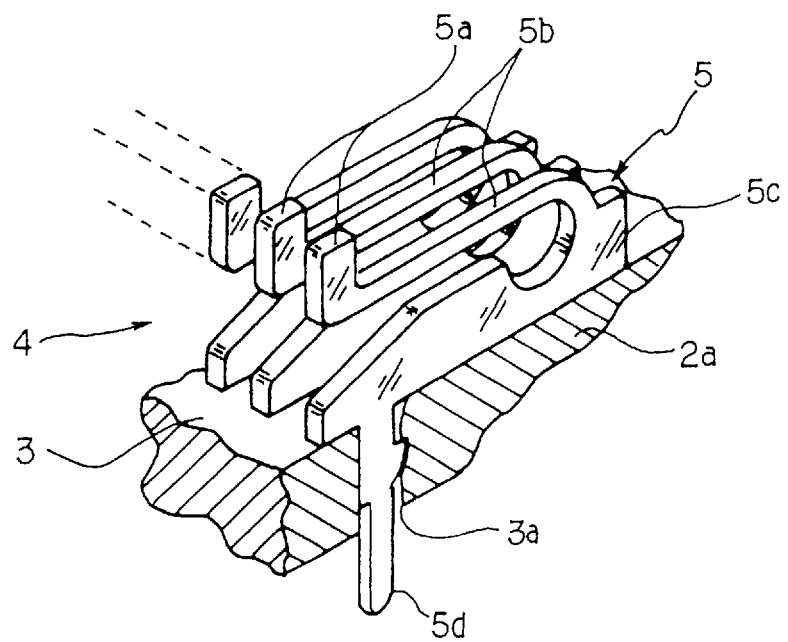
FIG. 6 is an enlarged fragmentary perspective view of a plurality of socket contact members forming part of the prior art test device shown in FIG. 5.

The multi-contact IC chip is shown in FIG. 4 as being a quadrilateral and flat packaging type IC chip 10 which has four side edge portions 10a each provided with a set of contact leads such as for example a set of lead pins 11. Each of the lead pins 11 is crooked to have an upper portion 11a, a lower contact portion 11b extending in parallel with the upper portion 11a, and a standing portion 11c perpendicularly extending and connected at its one end with the upper portion 11a and at its the other end with the lower contact portion 11b.

The reference numeral 50 designates depressing means for depressing each of the multi-contact IC chips 10 on the print-circuit board 40 under a depressing force. The depressing force is set at a certain force level sufficient to bring and hold the lead pins 11 of each IC chip 10 in contact with the socket contact members 32 of the contact units 23 through 26 and to make an electrical connection between each lead pin portion 11 of the IC chips 10 and each socket contact member 32 of the contact units 23 through 26.

The contact units 23 through 26 are identical in shape to one another, and two of the contact units 23 and 25 have a pair of contact support members 31 arranged in parallel with each other and each extending in a first direction, while the other two of the contact units 24 and 26 have a pair of contact support members 31 arranged in parallel with each other and each extending in a second direction perpendicular to the first direction. The contact units 23 through 26 thus number four, but may number two in the case that the integrated circuit chip is constituted by an IC chip having two side edge portions, such as for example a dual inline packaging type IC chip.

Each of the contact units 23 through 26 further includes a set of socket contact members 32 each made of conductive metal and supported by the contact support member 31. The socket contact members 32 of each contact unit 23, 24, 25 or 26 number "n" equal to the number of the lead pins 11 arranged in each of the side edge portions 10a of the multi-contact IC chip 10. Each of the contact support members 31 has a rectangular flat surface 31a having a length L1 and a width W1. The socket contact members 32 are arranged in a row at a predetermined pitch to form a contact region having a length L2 and a width W2, while the contact support members 31 are each molded out of a dielectric material or an insulation material to have the socket contact members 32 partly inserted therein. The contact support member 31 of each of the contact units 23 through 26 is thus elongated in a direction to support the socket contact members 32 in a row.

As best shown in FIG. 4, the socket contact members 32 of the contact units 23 through 26 have their respective inner end projection portions 32a, outer end portions 32b and bending arm portions 32c. Each of the inner end projection portions 32a of the socket contact members 32 is crooked to project from each of the arm portions 32c toward one of the lead pins 11 of the IC chip 10 so that the socket contact members 32 are able to contact with the lead pins 11 of the multi-contact IC chip 10. The outer end portions 32b of the socket contact members 32 are insulated from one another by the contact support member 31.

Between the bending arm portions 32c of the socket contact members 32 and the contact portions 41 of the print-circuit board 40, there are provided a plurality of anisotropic conductive sheet assemblies 61, 62, 63 and 64 each including a rectangular elastic insulation sheet 65 and a plurality of conductive wire members 66. The elastic insulation sheets 65 of the anisotropic conductive sheet assemblies 61 through 64 are made of an elastic insulation material such as for example a silicone rubber and have their respective shapes identical to one another. Each of the elastic insulation sheets 65 has its length L3, width W3 and thickness T3, and is held by the socket base 21 at its longitudinal both end portions and an inner side portion. The length L3 of each elastic insulation sheet 65 is equal to or larger than the length L2 of the contact region of the socket contact members 32, while the width W3 of each elastic insulation sheet 65 is equal to or smaller than the width W2 of the socket contact members 32. The conductive members 66 have their respective shapes identical to one another, and are embedded in the elastic insulation sheet 65 in parallel and equally spaced relationship to one another. The conductive members 66 in the elastic insulation sheet 65 extend in parallel to one another in the same direction slanting with respect to one and the other surfaces 65a and 65b of the elastic insulation sheet 65 with their both axial ends respectively flush with one and the other surfaces 65a and 65b of the elastic insulation sheet 65 and arranged in parallel to each other along the arm portions 32c of the conductive members 32. The both axial ends of the conductive members 66 are exposed to the atmosphere. The reference character "θ" shown in FIG. 3 denotes the cross angle between each axis of the conductive members 66 and one and the other surfaces 65a and 65b of the elastic insulation sheet 65. The cross angle θ is determined to be less than 90 degrees (0°<θ<90°). The conductive members 66 are composed of gold plated thin brass wires, but may consist of minute conductive members different from the brass wires in shape and material.

The anisotropic conductive sheet assemblies 61 through 64 are received in the socket base 21 on the print-circuit board 40 to have each of the conductive members 66 held in contact with one of the socket contact members 32 of the contact units 23 through 26 at the upper end portion 66a of each conductive member 66. The anisotropic conductive sheet assemblies 61 through 64 are also held in contact with the certain contact portions 41 of the print-circuit board 40 at the lower end portion 66b of each conductive member 66. The above angle θ can be reduced in response to a compression force exerted on each of the anisotropic conductive sheet assemblies 61 through 64, when each of the anisotropic conductive sheet assemblies 61 through 64 is elasticity compressed by the compression force and reduces its thickness T3. The anisotropic conductive sheet assemblies 61 through 64 may be constituted by a connector operated under pressure as disclosed in Japanese Patent Publication No. 63-29390.

Thus, the socket contact members 32 of the contact units 23 through 26 are respectively held in electrical communication with the contact portions of the printed-circuit board 40 through the conductive members 66 of the anisotropic conductive sheet assemblies 61 through 64 under the state that the anisotropic conductive sheet assemblies 61, 62, 63 and 64 are respectively pressed toward the contact portions of the print-circuit board 40 by the pressing portions 28b of the contact retainer 28.

On the other hand, the contact retainer 28 is adapted to bring the arm portions 32c of the socket contact members 32 into pressing contact with the conductive members 66 of the anisotropic conductive sheet assemblies 61 through 64 in cooperation with the elastic insulation sheet 65. The contact retainer 28 is also designed to position and partly expose each of the socket contact members 32 to be contactable with each of the contact members leads 11 of the IC chip 10. This means that electrical communication is established between the IC chip 10 and the print-circuit board 40 through the contact members 11, the socket contact members 32 and the conductive members 66 when the IC chip 10 is set in the test socket 20. The corners of the contact retainer 28 are each chamfered, and the central cavity 22 of the socket base 21 is slightly larger in square cross section than that of the contact retainer 28 and similarly chamfered at its four corners. This allows the contact retainer 28 to be fitted into the socket base 21 and to have the IC chip 10 removably received in the central cavity 22 of the socket base 21. The integrated circuit chip 10 is thus detachably mounted on the socket base 21 and held in electrical communication with the print-circuit board 40 for being tested in the test socket 20.

The contact retainer 28 further has four concave portions 28c and four through holes 28d into which the retainer screws are inserted in order to mount the contact retainer 28 on the socket base 21. The concave portions 28c of the contact retainer 28 are held in pressing contact with the contact support members 31 of the contact units 23 through 26 on the print-circuit board 40 when the retainer screws are screwed up to have the conductive members 66 of the anisotropic conductive sheet assemblies 61 through 64 pressed against the certain contact portions 41 of the print-circuit board 40 and the socket contact members 32 of the contact units 23 through 26. The anisotropic conductive sheet assemblies 61 through 64 are depressed by the depressing portions 28d of the contact unit 28 with a contact pressure sufficient to compress each of the elastic insulation sheets 65 by a certain small amount and to reduce the contact resistance between each end portion 66a or 66b of the conductive members 66 and either of the contact portions 41 of the print-circuit board 40 and the socket contact members 32 of the contact units 23 through 26.

The above contact pressure may be set at a pressure level sufficient to compress the elastic insulation sheets 65 by 20% of the thickness T3 in the case that the elastic insulation sheet 65 made of silicone rubber has a thickness set at 2.0 [mm] and the conductive members 66 are spaced apart from each other with a pitch of 0.1 [mm].

The above socket base 21, the contact units 23 through 26, the contact retainer 28, and the anisotropic conductive sheet assemblies 61 through 64 collectively define a square chip set space under the square center hole 28a of the contact retainer 28 to have the multi-contact IC chip 10 removably received in the chip set space, and allow the lead pins 11 of the multi-contact IC chip 10 to be brought into contact with the socket contact members 32 of the contact units 23 through 26. The lead pins 11 are respectively held in contact with the socket contact members 32 of the contact units 23 through 26 while the multi-contact IC chip 10 is being set in the test socket 20 and depressed by the depressing means 50.

On the other hand, the socket base 21 has a bottom portion 29 formed with an inner and outer bottom surfaces 29a and 29b and a plurality of bottom through holes 22a, 22b, 22c and 22d. The bottom through holes 22a through 22d of the socket base 21 also have the contact units 23 through 26 received therein and, accordingly, the socket contact members 32 penetrate through the bottom portion 29 of the socket base 21 to contact with the contact portions 41 of the test circuit board 40. Each of the bottom through holes 22a through 22d consists of a rectangular first portion and a rectangular second portion smaller than the first portion in area. The first portion of each bottom through hole 22a, 22b, 22c or 22d has a length L1' and a width W1', while the second portion of each bottom through hole has a length L3' and a width W3'. The lengths L1' and widths W1" of the first portions of the through holes 22a through 22d are approximately the same as or slightly larger than those of the contact units 23 through 26, while the lengths L3' and widths W3' of the second portions of the through holes 22a through 22d are exactly the same as or slightly smaller than those of the anisotropic conductive sheet assemblies 61 through 64. The depth of each bottom through hole 22a, 22b, 22c or 22d, i.e., the height from the outer bottom surface 29b of the socket base 21 to the inner bottom surface 29a of the socket base 21, is substantially equal to the height from the bottom surface of each contact unit 23, 24, 25 or 26 to the lower surface of the bending arm portion 32c of each socket contact member 32. The depth of each of the bottom through holes 22a through 22d is shown in FIG. 4 as being a height T3' of the bottom portion 29 of the socket base 21 approximately equal to the thickness T3 of each of the elastic insulation sheets 65 of the anisotropic conductive sheet assemblies 61 through 64. The height T3' of the bottom portion 29 is smaller than the depth of the concave portion 28c of the contact retainer 28, while the thickness of the contact support member 31 corresponds with the total of the thickness T3' of the bottom portion 29, thickness of the bending arm portion 30c of each socket contact member 32, and the depth of the concave portion 28c of the contact retainer 28. The length of each concave portion 28c of the contact retainer 28 is exactly the same as length L1' of each bottom through hole 22a, 22b, 22c or 22d.

The above inner end projection portions 32a of the socket contact members 32 may be flush with or retracted from the inner bottom surface 29a of the socket base 21 with a bottom portion of the socket base 21 partly thicker than the bottom portion 29 shown in FIG. 4, although the inner end projection portions 32a of the socket contact members 32 are assumed, by way example, as projecting from the inner bottom surface 29a of the socket base 21 in perpendicular relationship with the inner bottom surface 29a of the socket base 21.

The operation of the above test device will be described hereinlater.

At first, the socket base 21 is mounted on the print-circuit board 40 by the socket mounting screws. The contact units 23 through 26 are then respectively received in the bottom through holes 22a through 22d of the socket base 21, and the contact retainer 28 is received in the central cavity 22 of the socket base 21.

The retainer screws are then screwed up to have the conductive members 66 of the anisotropic conductive sheet assemblies 61 through 64 pressed against the contact portions of the print-circuit board 40 and the socket contact members 32 of the contact units 23 through 26 with a certain pressure level sufficient to compress the elastic insulation sheet 65 by a small amount and to reduce the contact resistance between each of the conductive members 66 of the anisotropic conductive sheet assemblies 61 through 64 and each of the contact portions of the print-circuit board 40 and the integrated circuit chip 10.

Other test sockets are also detachably mounted on the burn-in board in the same manner as above.

The multi-contact IC chip 10 is then set on the socket base 21, and is depressed by the depressing means 50 to have the lead pin portion 11 of the multi-contact IC 10 held in contact with the socket contact members 32 of the contact units 23 through 26. Similarly, other IC chips are set on other socket bases mounted on the print-circuit board 40, and the IC chips are depressed by other depressing means.

The multi-contact IC chip 10 and the test socket 20 are then supplied with electricity from the print-circuit board 40 and operated in accordance with a predetermined screening program at an atmospheric temperature more than 100° C. The multi-contact IC chip 10 and other IC chips are thus tested by performing the screening operation at a high temperature to screen in a short time every IC chip that is likely to develop trouble or to break down.

When the screening operation is finished, the multi-contact IC chip 10 is released from the depressing means 50 and replaced by a new multi-contact IC chip to be tested, and other IC chips on the print-circuit board 40 are also replaced by other new IC chips.

At this time, the inner end projection portions 32a of the socket contact members 32 are released from the depression means 50 and depressed again after the new IC chip is set in the test socket 20. This means that the socket contact members 32 are repeatedly depressed and released and therefore apt to become fatigued.

If one of the socket contact members 32 of the test socket 20 becomes fatigued and is finally damaged, the contact retainer 28 is removed from the socket base 21 by unscrewing the above retainer screws. Then, one of the contact units 23 through 26 including the fatigued and damaged socket contact member 32 is replaced by a new contact unit. The contact retainer 28 is then detachably mounted on the socket base 21 again by screwing the above retainer screws.

As will be appreciated from the foregoing description, the contact units 23 through 26 are easily received in the bottom through holes 23 through 26, and the test socket 20 can be repaired by replacing only part of the contact units 23 through 26 without removing the socket base 21 from the print-circuit board 40. Furthermore, each of the socket contact members 32 of the contact units 23 through 26 is simply shaped not to include a plurality of crooked portions. This makes it possible not only to easily maintain the test sockets on the print-circuit board 40 even if the socket bases 21 are securely mounted on the print-circuit board 40, but also to reduce the maintenance cost of the test device including the test sockets 20 and the print-circuit board 40.

In addition, the lead pins 11 of the multi-contact IC chip 10 are held in electrical communication with the contact portions of the printed-circuit board 40 through the socket contact members 32 of the contact units 23 through 26 and at least part of the conductive members 66 of the anisotropic conductive sheet assemblies 61 to 64 directly held in contact with the contact portions of the printed-circuit board 40. This results in the fact that the lead pins 11 of the multi-contact IC chip 10 are respectively connected to the contact portions 41 of the printed-circuit board 40 with the shortest electrical communication paths passing through the inner end projection portions 32a of the socket contact members 32 and the conductive members 66 of the anisotropic conductive sheet assemblies 61 through 64. It is therefore possible to minimize electrical resistance and inductance between the lead pins 11 of the multi-contact IC chip 10 and the contact portions of the printed-circuit board 40 to improve the electrical characteristic of the test device to the degree sufficient to utilize the test device for testing quick-access IC chips.

Furthermore, the anisotropic conductive sheet assemblies 61 through 64 can be modified to prevent the contact units 23 through 26 from being inclined respectively in the bottom through holes 22a through 22d and from being dropped from the holes 22a through 22d of the socket base 21. The test socket 20 can also be modified to have a new contact unit having a plurality of socket contact members different from those of the contact units 23 through 26 or to change the number of the socket contact members 32 and the pitch between adjacent two socket contact members 32. This results in the fact that the test socket 20 can be used for testing various IC chips different from one another in size, lead pitch or the like.

The present invention has thus been shown and described with reference to specific embodiments, however, it should be noted that the present invention is not limited to the details of the illustrated structures but changes and modifications may be made without departing from the scope of the appended claims.

What is claimed is:

1. A test device for testing a multi-contact integrated circuit chip package having a plurality of side edge portions each having a set of contact leads, the test device comprising:

a socket base on which the integrated circuit chip package is to be set;

at least one contact module, removably mounted on said socket base, the module including a plurality of contact members for contacting said contact leads of said integrated circuit chip package and support member means for holding said contact members;

an anisotropic conductive sheet assembly comprising an elastic insulation sheet having a front and a back surface and a plurality of spaced parallel conductive wires extending between the front and back surfaces at an angle thereto, the anisotropic sheet assembly removably positioned in the socket base adjacent to the contact members; and a contact module retainer means detachably mounted on said socket base for retaining said contact module in said socket base with said contact members positioned to contact the contact leads of the integrated circuit packaged when the integrated circuit package is inserted in the socket base and to also contact the conductive wires in the anisotropic sheet in the socket base.

2. A test device as set forth in claim 1, in which said socket base further comprises a through hole formed therein and respectively having said anisotropic conductive sheet assembly received therein.

3. A test device as set forth in claim 2, in which each of said contact members of said at least one contact module has an arm portion held in pressing contact with part of said conductive wires of said anisotropic conductive sheet assemblies, and a projection portion projecting from the arm portions toward one of said contact leads of said integrated circuit chip package.

4. A test device as set forth in claim 3, in which said conductive wires of said anisotropic conductive sheet assembly have their both axial ends respectively flush with the front and back surfaces of said elastic insulation sheet and arranged along said arm portions of said contact members.

5. A test device as set forth in claim 1, in which said socket base is formed with a central cavity having said contact retainer fitted into said socket base and having said integrated circuit chip package removably received therein.

6. A test device for testing a multi-contact integrated circuit chip package having a plurality of side edge portions each having a set of contact leads, the test device comprising:

a test circuit board having a plurality of contact portions and operable to perform a testing operation for testing said integrated circuit chip package;

a socket base on which the integrated circuit chip package is to be set, said socket base being mounted on said test circuit board;

at least one contact module, removably mounted on said socket base, the module including a plurality of contact members for contacting said contact leads of said integrated circuit chip package and support member means for holding said contact members;

an anisotropic conductive sheet assembly comprising an elastic insulation sheet having a front and a back surface and a plurality of spaced parallel conductive wires extending between the front and back surfaces at an angle thereto, the anisotropic sheet assembly removably positioned in the socket base between the contact members and the circuit board contact portions; and a contact module retainer means detachably mounted on said socket base for retaining said contact module in said socket base with said contact members positioned to contact the contact leads of the integrated circuit packaged when the integrated circuit package is inserted in the socket base and to also contact the conductive wires in the anisotropic sheet in the socket base while also contacting the conductive wires in the anisotropic sheet to the contact portions of the test circuit board.

7. A test device as set forth in claim 6, in which said socket base further comprises a through hole formed therein and respectively having said anisotropic conductive sheet assembly received therein to allow said conductive wires to be brought into contact with said contact portions of said test circuit board.

8. A test device as set forth in claim 6, in which each of said contact members of said at least one contact module has an arm portion held in pressing contact with part of said conductive wires of said anisotropic conductive sheet assembly on said test circuit board, and a projection portion projecting from the arm portions toward one of said contact leads of said integrated circuit chip package.

9. A test device as set forth in claim 8, in which said conductive wires of said anisotropic conductive sheet assembly have their both axial ends respectively flush with the front and back of said elastic insulation sheet and arranged along said arm portions of said contact members.

10. A test device as set forth in claim 6, in which said socket base is formed with a central cavity having said contact retainer fitted into said socket base and having said integrated circuit chip package removably received therein.

* * * * *